(12) United States Patent
Shrestha

(10) Patent No.: US 8,896,377 B1
(45) Date of Patent: Nov. 25, 2014

(54) APPARATUS FOR COMMON MODE SUPPRESSION

(71) Applicant: NXP B.V., Eindhoven (NL)

(72) Inventor: Rameswor Shrestha, Eindhoven (NL)

(73) Assignee: NXP B.V., Eindhoven (NL)

(*) Notice: Subject to any disclaimer, the term of this patent is extended or adjusted under 35 U.S.C. 154(b) by 73 days.

(21) Appl. No.: 13/904,879

(22) Filed: May 29, 2013

(51) Int. Cl.
- *H03F 3/45* (2006.01)
- *H02M 3/06* (2006.01)
- *H04M 1/00* (2006.01)

(52) U.S. Cl.
USPC ...... 330/258; 330/302; 307/109; 379/392.01; 381/120

(58) Field of Classification Search
USPC .............. 307/109; 379/392.01; 381/120
IPC ................. H04M 1/00; H02M 3/06; H03F 3/45
See application file for complete search history.

(56) References Cited

U.S. PATENT DOCUMENTS

| | | | |
|---|---|---|---|
| 3,273,033 A | 9/1966 | Rossmeisl | |
| 4,292,595 A | 9/1981 | Smith | |
| 4,748,419 A | 5/1988 | Somerville | |
| 5,138,436 A | 8/1992 | Koepf | |
| 5,187,636 A | 2/1993 | Nakao | |
| 5,187,637 A | 2/1993 | Embree | |
| 5,321,597 A | 6/1994 | Alacoque | |
| 5,568,561 A * | 10/1996 | Whitlock | 381/120 |
| 6,271,131 B1 | 8/2001 | Uhlenbrock | |
| 6,331,999 B1 | 12/2001 | Ducaroir | |
| 6,347,395 B1 | 2/2002 | Payne | |
| 6,429,735 B1 | 8/2002 | Kuo | |
| 6,507,226 B2 | 1/2003 | Swonger | |
| 6,636,166 B2 | 10/2003 | Sessions | |
| 6,664,859 B1 | 12/2003 | Chen | |
| 6,809,569 B2 | 10/2004 | Wang | |
| 6,839,862 B2 | 1/2005 | Evoy | |
| 6,859,883 B2 | 2/2005 | Svestka | |
| 6,882,046 B2 | 4/2005 | Davenport | |
| 6,920,576 B2 | 7/2005 | Ehmann | |

(Continued)

FOREIGN PATENT DOCUMENTS

| | | |
|---|---|---|
| EP | 1291918 A2 | 3/2003 |
| EP | 1564884 A1 | 8/2005 |
| GB | 2204467 A | 11/1988 |

OTHER PUBLICATIONS

Greg Smith, "Hybrid Isolation Amps Zap Price and Voltage Barriers" Electronic Design, Dec. 11, 1986.

(Continued)

*Primary Examiner* — Patricia Nguyen

(57) ABSTRACT

An apparatus is provided that includes first and second ICs configured to communicate using a plurality of differential signal lines. The apparatus includes a common mode suppression circuit having a plurality of common mode voltage adjustment circuits, each configured to provide a low impedance path for common mode signals and a high impedance path for differential AC signaling, thereby suppressing the effect of common mode transients between the voltage domains. The plurality of common mode voltage adjustment circuits each have components that are impedance matched up to an impedance-tolerance specification. The common mode suppression circuit also includes an AC coupling circuit configured to be less dependent on impedance mismatch, beyond the impedance-tolerance specification, by cross coupling the impedance differentials from each of the differential signal lines through the AC coupling circuit and to one of the common mode voltage adjustment circuits.

20 Claims, 3 Drawing Sheets

(56) References Cited

U.S. PATENT DOCUMENTS

| | | | |
|---|---|---|---|
| 6,992,377 B2 | 1/2006 | Zhou et al. | |
| 7,199,617 B1 | 4/2007 | Schrom | |
| 7,302,247 B2 | 11/2007 | Dupuis | |
| 7,376,212 B2 | 5/2008 | Dupuis | |
| 7,400,173 B1 | 7/2008 | Kwong | |
| 7,411,421 B1 | 8/2008 | Steinke | |
| 7,421,028 B2 | 9/2008 | Dupuis | |
| 7,447,492 B2 | 11/2008 | Dupuis | |
| 7,460,604 B2 | 12/2008 | Dupuis | |
| 7,577,223 B2 | 8/2009 | Alfano et al. | |
| 7,650,130 B2 | 1/2010 | Dupuis | |
| 7,732,889 B2 | 6/2010 | Crawley | |
| 7,737,871 B2 | 6/2010 | Leung et al. | |
| 7,738,568 B2 | 6/2010 | Alfano et al. | |
| 7,755,400 B2 | 7/2010 | Jordanger et al. | |
| 7,821,428 B2 | 10/2010 | Leung et al. | |
| 7,856,219 B2 | 12/2010 | Dupuis | |
| 7,902,627 B2 | 3/2011 | Dong et al. | |
| 7,964,993 B2 * | 6/2011 | Cai et al. | 307/91 |
| 8,049,573 B2 | 11/2011 | Alfano et al. | |
| 8,064,872 B2 | 11/2011 | Dupuis | |
| 8,169,108 B2 | 5/2012 | Dupuis et al. | |
| 8,284,823 B2 | 10/2012 | Breitfuss | |
| 2001/0052623 A1 | 12/2001 | Kameyama | |
| 2002/0021144 A1 | 2/2002 | Morgan | |
| 2002/0184544 A1 | 12/2002 | Svestka et al. | |
| 2002/0186058 A1 | 12/2002 | Prodanov | |
| 2003/0214346 A1 | 11/2003 | Pelliconi | |
| 2004/0076192 A1 | 4/2004 | Zerbe | |
| 2004/0159893 A1 | 8/2004 | Kitahara | |
| 2004/0161068 A1 | 8/2004 | Zerbe | |
| 2005/0127452 A1 | 6/2005 | Rippke | |
| 2005/0174156 A1 | 8/2005 | Wu | |
| 2006/0138595 A1 | 6/2006 | Kiyotoshi | |
| 2006/0251188 A1 * | 11/2006 | Crawley et al. | 375/319 |
| 2007/0075784 A1 | 4/2007 | Pettersson | |
| 2008/0174360 A1 | 7/2008 | Hsu | |
| 2008/0290444 A1 | 11/2008 | Crawley | |
| 2009/0017773 A1 | 1/2009 | Dupuis et al. | |
| 2009/0146760 A1 | 6/2009 | Reefman | |
| 2009/0213914 A1 | 8/2009 | Dong et al. | |
| 2009/0237858 A1 | 9/2009 | Steeneken | |
| 2009/0243028 A1 | 10/2009 | Dong et al. | |
| 2010/0052826 A1 | 3/2010 | Callahan et al. | |
| 2010/0118918 A1 | 5/2010 | Dupuis | |
| 2010/0327940 A1 | 12/2010 | Eisenstadt | |
| 2011/0006814 A1 | 1/2011 | Acar | |

OTHER PUBLICATIONS

Wally Meinel, et al., "Hermetic Analog Isolation Amplifier", Proceedings of the 1987 International Symposium on Microelectronics, Minneapolis, Sep. 1987.

Burr Brown, Noise Sources in Applications Using Capacitive Coupled Isolated Amplifiers, Application Bulletin, Burr Brown Corporation, 1993.

Burr Brown, Hybrid Isolation Amps Zap Price and Voltage Barriers, Application Bulletin, Burr Brown Corporation, 1994.

Burr Brown, An error analysis of the ISO102 in a small signal measuring application, Application Bulletin, Burr Brown Corporation, 1994.

Burr Brown, ISO 102, ISO 106 Signal Isolation Buffer Amplifiers, Datasheet, Burr Brown Corporation, 1995.

J. Basilio Simoes, et al., "The Optical Coupling of Analog Signals" IEEE Transaction on Nuclear Science, vol. 43, No. 3, Jun. 1996, pp. 1672-1674.

Stephen L. Diamond, "IEEE 1394: Status and growth path", IEEE Micro, Jun. 1996, pp. 75-78.

Thaddeus J. Gabara, et al., "Capacitive coupling and quantized feedback applied to conventional CMOS technology" IEEE Journal of Solid-State Circuits, vol. 32, No. 3, Mar. 1997.

Adrian Paskins, "The IEEE 1394 BUS", The Institution of Electrical Engineers Conference, May 12, 1997.

Richard Crisp, "Direct Rambus Technology: The New Main Memory Standard" IEEE Micro, Nov./Dec. 1997, pp. 18-28.

Thomas Nilsson, "A distributed combined heat and power plant control unit", Master Thesis, Linköping Institute of Technology, Dec. 16, 1997.

Scott Wayne, "Finding the Needle in a Haystack: Measuring Small differential voltages in the presence of large-common mode voltages", Analog Dialogue, 34-1, 2000, pp. 1-4.

Infineon Technologies, IVAX Integrated Voice & ADSL Transceiver, PEB35512, PEB55508, PEB3558, PEB4565, PEB4566, Datasheet, Infineon Technologies AG, 2001.

William B. Kuhn, et al., "An RF-based IEEE 1394 Ground Isolator designed in silicon-on-insulator process" Circuits and Systems, 2001. MWSCAS 2001. Proceedings of the 44th IEEE 2001 Midwest Symposium on ,vol. 2 , Aug. 14-17, 2001.

Scott Irwin, XILINX, "Usage Models for multi-gigabit serial transceivers", WP157, V.1.0, Mar. 15, 2002.

phyCORE-MCF548x Hardware Manual, PHYTEC Technology Holding Company, Jan. 2005.

Lantronix, Xpress-DR+Wireless, Datasheet, Lantronix, 2006.

Eugenio Culurciello, et al., "Capacitive inter-chip data and power transfer for 3-D VLSI" IEEE Trans. Circuits Syst. II, vol. 53, No. 12, pp. 1348-1352, 2006.

Geoffrey Marcus, et al., "A Monolithic Isolation Amplifier in silicon-on-isolator CMOS: Testing and Applications", Analog Integr. Circ. Sig. Process, Jun. 27, 2006.

Inoue, A., et al "A high efficiency, high voltage, balanced cascode FET", IEEE International Microwave Symposium, Jun. 1995.

S. M. Sze, "Semiconductor Devices Physics and Technology", 2nd Edition, John Wiley and Sons, Inc., pp. 493-494 and 503-507, 1985, 2002.

Burr Brown, ISO 103, Low Cost, Internally Powered Isolation Amplifier, IC Publication Datasheet, Burr Brown Corporation, 1989.

Stephen Mick, et al., "Packaging Technology for AC Coupled Interconnection", IEEE Flip-Chip Conference, 2002.

Abedinpour S., Bakkoglu B., with Integrated Output Filter in 0.18 m SiGe Process, IEEE Kiaei S., A Multistage Interleaved Synchronous Buck Converter Transactions on Power Electronics, vol. 22, No. 6, Nov. 2007.

Aoki I., Kee S., Magoon R., Aparicio R., Bohn F., Zachan J., Hatcher G., McClymont D., Hajimiri A., "A Fully Integrated Quad-Band GSM/GPRS CMOS Power Amplifier", International Solid-State Circuits Conference, 2007.

Kursun V., Narendra S.G., De V.K., Friedman E.G., "High input voltage step-down DC-DC converters for integration in a low voltage CMOS process", Quality Electronic Design, 2004.

Rocha J., Santos M., Dores Costa J.M., Lima F., "High Voltage Tolerant Level Shifters and DCVSL in Standard Low Voltage CMOS Technologies", IEEE, 2007.

Sonsky J., Heringa A., Perez-Gonzalez J., Benson J., Chiang P.Y., Bardy S., Volokhine I."Innovative High Voltage transistors for complex HV/RF SoCs in baseline CMOS", IEEE, 2008.

* cited by examiner

APPARATUS FOR COMMON MODE SUPPRESSION

Aspects of the present disclosure relate to apparatuses, devices, and methods involving communication between isolated voltage domains. Galvanic isolation, for example, has often been used in this regard for a variety of different applications. Such isolation can be provided between multiple integrated circuit (IC) chips, which can be located within the same package or in different packages.

Capacitive, magnetic, and optical coupling circuits are common examples of circuits that provide isolation in order to operate the isolated circuits in their respective and separate voltage domains and with different common (or ground) voltage references. For instance, applications such as electric vehicles and motor drivers employ high voltage and low voltage domains, in which the low voltage domain may be used for controlling aspects of the high voltage domain. In such applications, the respective domains are desirably isolated from each other in order to avoid damage to the circuits due to current surges and high voltage transients. In such applications, the intelligence and control are often located at the low voltage side—requiring reliable communication between the high and low voltage domains.

One type of isolation technique involves the use of differential signaling and capacitive coupling. These and other galvanic isolation techniques have various undesirable tradeoffs in properties such as, but not necessarily limited to, signal propagation delays, power consumption, pulse width distortion, common mode (CM) transient immunity, and carrier frequency requirements. Differential signaling solutions use two separate wires upon which corresponding signals are then transmitted differentially (i.e., as voltage differences between the signal lines). For instance, first and second signals that are 180 degrees out of phase with each other may be transmitted on respective ones of the differential signal lines. A receiver may retrieve a data signal by comparing the voltage difference of differential signal lines. The differentially transmitted signals can be modulated in a number of different manners in order to convey data. A few non-limiting examples include frequency modulation, amplitude modulation, and on-off key (OOK) modulation.

In communicating differential signals between isolated systems, the component of an analog signal that is present with one sign (positive or negative) on the signal-carrying lines, is known as a common mode signal which is the half-sum of the corresponding voltages. Transient CM signals may be present in both differential signal lines depending on the transients between the grounds of the voltage domains. Such change in voltage between grounds results in unwanted current flow through isolation capacitor Aspects of the present disclosure relate generally to methods, circuits and devices for the communication of data between isolated circuits.

In some embodiments, an apparatus is provided that includes first and second ICs that are isolated from each other by an isolation barrier (e.g., galvanic isolation). The apparatus includes two or more differential signal lines, including an upper signal line and a lower signal line, for carrying differential signals from the first IC, across the isolation barrier, to the second IC. The apparatus includes a CM suppression circuit that is coupled to the differential signal lines, within the second IC, and is configured to suppress CM signals on the differential signal lines. The CM suppression circuit includes a plurality of common mode voltage adjustment (CMVA) circuits, each configured to provide a low impedance path for CM signals and a high impedance path for differential AC signaling, thereby suppressing the effect of CM transients between the voltage domains. The plurality of CMVA circuits each have components that are impedance matched to corresponding components in another of the plurality of symmetrical current paths. The corresponding components are impedance matched up to an impedance-tolerance specification. Each of the plurality of CMVA circuits is electrically connected to a respective one of the plurality of signal lines.

The CM suppression circuit also includes an AC coupling circuit providing a plurality of AC signal paths. Each of the plurality of AC signal paths have a node connected to a respective one of the plurality of CMVA circuits. The AC coupling circuit is configured to be less dependent on impedance mismatch, beyond the impedance-tolerance specification, by cross coupling the impedance differentials from each of the respective nodes through the AC coupling circuit and to another of the CMVA circuits.

In some embodiments, an apparatus is provided that includes first and second ICs having respective function circuits that operate in different respective voltage domains. The apparatus includes a plurality of signal lines configured and arranged on opposing sides of an isolation barrier for carrying signals from the first IC, across the isolation barrier, to a receiving side of the differential signal lines coupled to the second IC.

A CM suppression circuit is disposed on the second IC and includes a plurality of CMVA circuits. Each CMVA circuit is configured to adjust common mode voltage of a respective one of the plurality of signal lines. Each CMVA circuit includes at least one impedance-adjustable current path having an impedance response that is matched, with an impedance response of a corresponding impedance-adjustable current path of another of the plurality of CMVA circuits, up to an impedance-tolerance specification. The impedance response is mismatched beyond the impedance-tolerance specification. The CM suppression circuit also includes a cross-coupling circuit configured to pass in-phase signals from the plurality of signal lines to the plurality of CMVA adjustment circuits to control the CMVA circuits. The cross-coupling circuit is configured to adjust the respective control signals to cause the corresponding impedance-adjustable current paths to operate with impedances that are matched beyond the impedance-tolerance specification.

The above summary is not intended to describe each embodiment or every implementation of the present disclosure. The figures, detailed description, and claims that follow more particularly exemplify various embodiments.

Aspects of the present disclosure may be more completely understood in consideration of the detailed description of various embodiments of the present disclosure that follows in connection with the accompanying drawings, in which.

Figure 1:
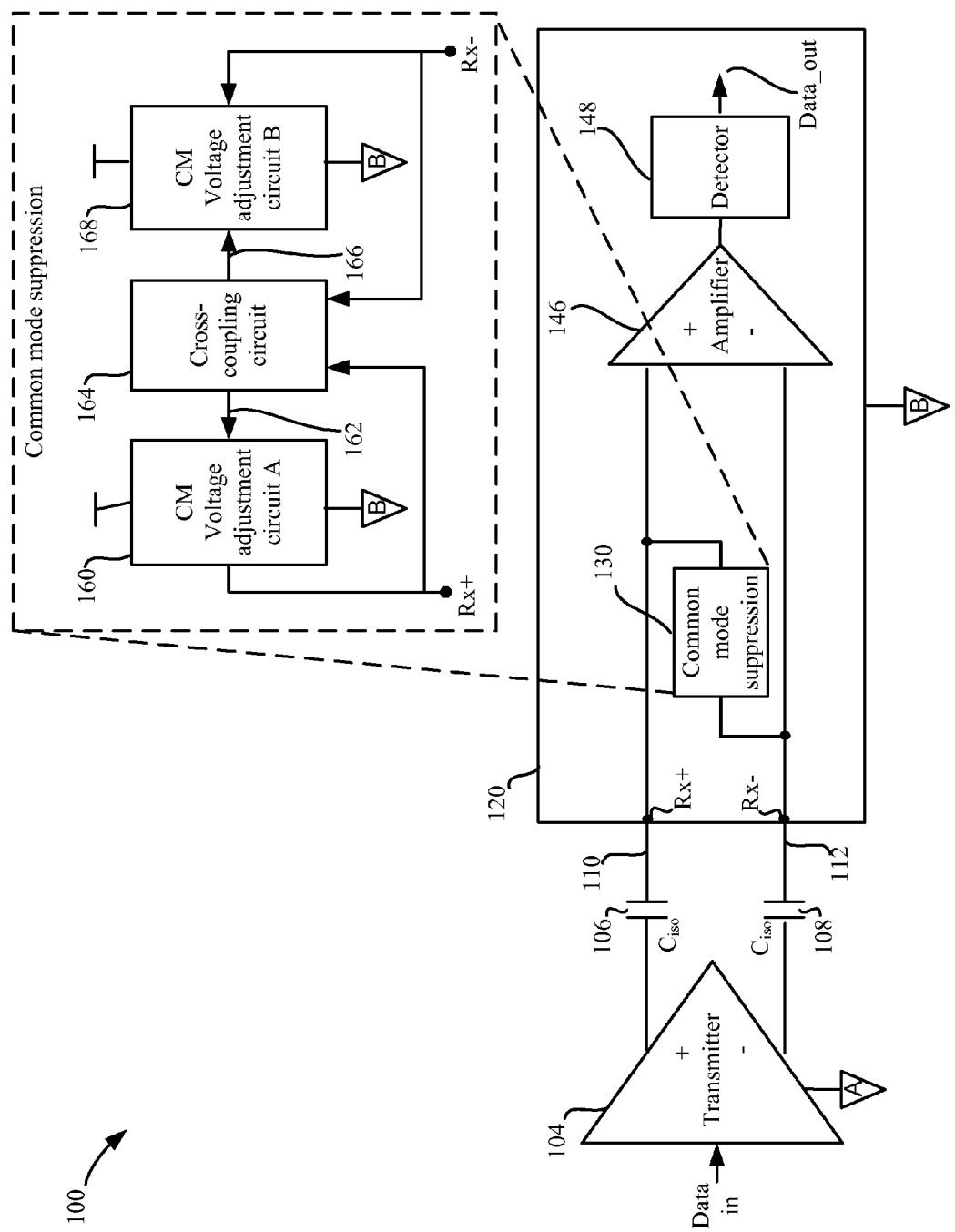
FIG. 1 shows a block diagram of a system for communicating between a transmitter and a receiver, with operation in different voltage domains, consistent with one or more embodiments of the present disclosure.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. While the present disclosure is not necessarily limited in this context, various aspects of the disclosure may be appreciated through a discussion of related examples.

Aspects of the present disclosure relate to the transmission of data between circuits that are isolated from one another. For example, circuits may be isolated using capacitive coupling on signal paths between the circuits. As a result of such isolation, the circuits operate in separate voltage domains that are not referenced to one another by a common ground voltage level. As such, voltage differences may arise between the corresponding voltage domains. For certain applications, such as in automotive environments, the voltage differences have the potential to be large (e.g., hundreds or thousands of volts in electrically powered vehicles). Although the circuits may be capacitively isolated, current may be passed by isolation capacitors used for capacitive coupling in response to CM transients between the voltage domains. As a result, the ability of isolation capacitors to provide transient immunity is limited thereby decreasing the reliability of data communication between the voltage domains. Embodiments of the present disclosure are believed to be applicable to communication methods, devices and systems involving data communication protocols between isolated circuits.

In some embodiments, an apparatus is provided that includes first and second ICs that are isolated from each other by an isolation barrier (e.g., inductive or capacitive isolation). The first and second IC having respective circuits that operate in respective voltage domains. The apparatus includes a plurality of signal lines, including an upper signal line and a lower signal line, for carrying differential signals from the first IC, across the isolation barrier, to the second IC. In some embodiments, the first IC is configured and arranged to both transmit and receive signals across the barrier. However, for ease of illustration and explanation, the examples herein are primarily discussed with reference to transmission of signals from the first IC to the second IC.

The second IC includes a CM suppression circuit configured to remove CM voltage transients from the signal lines by sourcing or sinking the transient current that flows via isolation capacitors as a result of change in voltages between the grounds. The CM suppression circuit includes a plurality of CMVA circuits, each configured to adjust CM voltage on a respective one of the signal lines. For instance, in some implementations, each of the CMVA circuits are configured to provide a low impedance path for a CM signal and a high impedance path for differential AC signaling, thereby suppressing the effect of CM transients between the voltage domains.

Each CMVA circuit includes at least one impedance-adjustable current path having an impedance response that is matched, with an impedance response of a corresponding impedance-adjustable current path of another of the plurality of CMVA circuits, up to an impedance-tolerance specification. For instance, two matched field effect transistors (FETs) may exhibit respective impedances, in response to a reference voltage being applied to the FET gate, that differ by an amount less than or equal to the impedance-tolerance specification. Such differences may be due to, e.g., different gate dimensions or threshold voltage caused by process variation in the manufacture of the FETs. As one example, two FETs that exhibit an impedance difference of 0.25Ω are matched for an impedance-tolerance of 1Ω, but are mismatched when measured at more stringent tolerances (e.g., 100 mΩ tolerance). Due to the mismatch in impedances, if not compensated for, CMVA circuits will pass slightly different amounts of current from respective signal lines in attempting to remove CM voltages. These slight differences introduce noise into the differential signal.

In some embodiments, a CM suppression circuit includes a plurality of CMVA circuits and an AC coupling circuit providing a plurality of AC signal paths. Each of the plurality of AC signal paths have a node connected to a respective one of the plurality of CMVA circuits. The AC coupling circuit is configured to be less dependent on impedance mismatch, beyond the impedance-tolerance specification, by cross coupling the impedance differentials from each of the respective nodes through the AC coupling circuit and to another of the CMVA circuits.

In some embodiments, the plurality of CMVA circuits and the AC coupling circuit are configured and arranged to provide CM suppression of such noise caused by impedance mismatched beyond the impedance-tolerance specification.

In some embodiments, the AC coupling circuit includes a capacitance-based circuit for providing AC coupling via each of the plurality of AC signal paths.

In some embodiments, a CM suppression circuit includes a plurality of CMVA circuits and a cross-coupling circuit. The CMVA circuits are each configured to adjust CM voltage of a respective signal line (e.g., according to respective signals provided from the respective signal lines by a cross coupling circuit). In some implementations, the cross coupling circuit is configured to pass in-phase signals from the plurality of signal lines to the plurality of CMVA circuits (160, 168) as respective control signals. The cross-coupling circuit is configured to adjust the respective control signals to cause the corresponding impedance-adjustable current paths to operate with impedances that are matched beyond the impedance-tolerance specification.

In some embodiments, the cross-coupling circuit is configured to pass signals in a frequency range to facilitate cancellation of signals ensuing from the impedance response of impedance-adjustable current paths of the plurality of CMVA circuits being mismatched beyond the impedance-tolerance specification.

In some embodiments a first one of the control signals, corresponding to a first and second CMVA circuits, have voltage levels that differ by an amount proportional to an amount of impedance mismatch between the corresponding impedance-adjustable current paths.

In some embodiments, each of the plurality of CMVA circuits includes a clamp circuit having an output coupled to the corresponding one of the plurality of signal lines. In some implementations, each clamp circuit is a CMOS inverter circuit and the isolation barrier is arranged to provide galvanic isolation between the functional circuitry of the first IC and the functional circuitry of the second IC.

In some embodiments, the cross-coupling circuit includes first and second resistors and first and second capacitors. The first resistor has a first end coupled to an input of the first clamp circuit and a second end coupled to the output of the first clamp circuit. The second resistor has a first end coupled to an input of the second clamp circuit and a second end coupled to the output of the first clamp circuit. The first capacitor has a first terminal coupled to the output of the first clamp circuit and a second terminal coupled to the input of the second clamp circuit. The second capacitor has a first terminal coupled to the input of the second clamp circuit and a second terminal coupled to the input of the first clamp circuit.

In some embodiments, the cross-coupling circuit further includes third and fourth capacitors. The third capacitor has a first terminal coupled to the input of the first clamp circuit and a second terminal coupled to the output of the first clamp circuit. The fourth capacitor has a first terminal coupled to the input of the second clamp circuit and a second terminal coupled to the output of the second clamp circuit.

It is recognized that signals may be communicated using various numbers of signal lines. For instance, in some embodiments, the plurality of signal lines includes a pair of lines configured and arranged to carry differential signals that have opposing phases. In some other embodiments, the plurality of signal lines includes three signal lines configured and arranged to carry tri-differential signals. For ease of illustration and explanation, examples are primarily described with reference to differential signaling via a pair of signal lines.

The second IC may include additional circuits to process differential signals received over the signal lines. For instance, in some embodiments, the second IC includes an amplifier coupled to the plurality of signal lines that is configured to receive the differential signals. In some embodiments, the second IC further includes a signal detector responsive to an output signal generated by the amplifier.

Turning now to the figures, FIG. 1 depicts a block diagram of a system for communicating between a transmitter and a receiver, with operation in different voltage domains, consistent with one or more embodiments of the present disclosure. The system 100 includes a transmitter 104 and a receiver 120, which are isolated from one another and operate in separate voltage domains A and B. In this example, the system is configured to communicate data values over a set of two differential signal lines 110 and 112. Capacitive coupling of the signal line is provided by isolation capacitors 106 and 108. For instance, in one embodiment, a first end of each signal line 110 and 112 (connected to differential outputs of the transmitter 104) is connected to a first plate of a respective capacitor (e.g., 106 or 108). A second end of each signal line (connected to differential inputs Rx+ and Rx− of the receiver 120) is connected to a second plate of the corresponding capacitor. Each capacitor provides isolation between the first and second ends of the corresponding signal line.

The transmitter 104 is configured to modulate a received data signal and transmit the modulated data signal to the receiver 120 as a differential signal. An amplifier (e.g., comparator 146) is connected to differential input nodes connected to the differential signal lines 110 and 112 (e.g., Rx+ and Rx−). The comparator 146 and a detector 148 are configured to demodulate differential signals communicated to the differential input nodes via the differential signal lines 110 and 112). The comparator 146 compares voltages at the differential input nodes to generate a voltage difference. The detector 148 generates a demodulated signal (Data_out) based on the voltage difference generated by the comparator 146. In some various embodiments, data communicated from the transmitter 104 to the receiver 120 as differential signals may be modulated using various modulation schemes. For instance, for certain high-speed applications, different types of modulation schemes can be used for carrying information across the isolation region, including but not limited to OOK, amplitude, phase-based and/or frequency-based modulation. In some implementations, the demodulation of the differential signals performed by the comparator 146 and detector 148 also demodulates the signals according to an additional modulation scheme, such as OOK.

A CM suppression circuit 130 is coupled to the signal lines 110 and 112 (via input nodes Rx+ and Rx−) and is configured to suppress CM voltages and add opposite phases of the differential signals communicated on the differential signal lines. The CM suppression circuit 130 includes a plurality of CMVA circuits (160 and 168), each configured to adjust CM voltage on a respective one of the signal lines (110 and 112) that are connected to inputs Rx+ and Rx−. The CM suppression circuit 130 also includes a cross-coupling circuit that causes the CMVA circuits (160 and 168) to remove CM voltages from the respective signal lines. For ease of reference, the cross-coupling circuit may be referred to as an AC coupling circuit herein.

The CMVA circuits (160 and 168) and coupling circuit 164 are configured to provide a low impedance path (e.g., to sink CM currents to ground) and provide a high impedance path for differential AC signaling. In this manner, CM signals are reduced while differential AC signals are preserved. The CMVA circuits and the cross-coupling circuit are described in more detail with reference to the example circuits shown in FIGS. 2 and 3.

Figure 2:
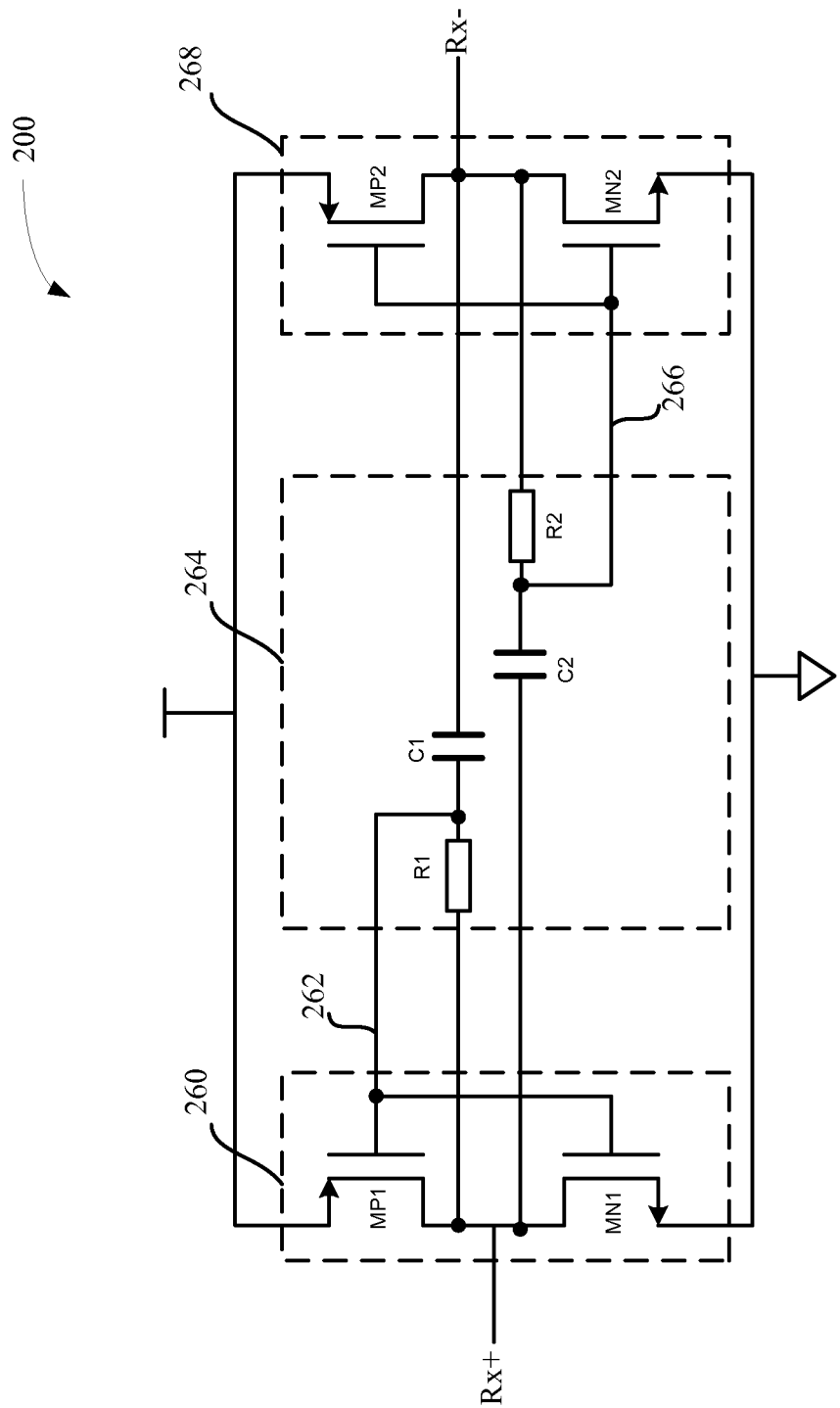
FIG. 2 shows a CM suppression circuit, in accordance with one or more embodiments of the present disclosure.

FIG. 2 shows a CM suppression circuit, in accordance with one or more embodiments of the present disclosure. The CM suppression circuit 200 may be used, for example, to implement the CM suppression circuit 130 shown in FIG. 1.

The CM suppression circuit 200 includes a plurality of CMVA circuits 260 and 268 that may be used to implement the CMVA circuits 160 and 168 of FIG. 1 in some embodiments. Each of the CMVA circuits is configured to adjust CM voltage on a respective one of the signal lines (not shown) that are connected to inputs Rx+ and Rx−.

The CM suppression circuit 200 also includes a cross-coupling circuit 264 that causes the CMVA circuits 260 and 268 to remove CM voltages from the respective signal lines. The cross-coupling circuit may be used, e.g., to implement the coupling circuit 164 of FIG. 1.

In this example, the CMVA circuits include impedance-adjustable current paths (e.g., FETs MP1 and MN1) that are configured with the coupling circuit 264 to provide low impedance path (e.g., to sink CM currents to ground) and provide a high impedance path for differential AC signaling. The respective FETs of each CMVA circuit (e.g., 260) have a respective impedance response that is matched with an impedance response of a corresponding FET of the other CMVA circuit (e.g., 268). The impedances are matched up to an impedance-tolerance specification. As described above, due to the mismatch in impedances beyond the impedence-tolerance specification, CMVA circuits may pass slightly different amounts of current from respective signal lines in attempting to remove CM voltages that may result in noise unless such differences are compensated for. The coupling circuit is configured to compensate for noise introduced by such mismatch.

In this example, each CMVA circuit (e.g., 260) includes two FETs (e.g., MP1 and MN1) connected in a clamp circuit arrangement, as shown in FIG. 2. The CMVA circuits 260 and 268 are each configured to adjust CM voltage of a respective signal line in response to a respective control signal (e.g., at input nodes 262 and 266 of the CMVA circuits). In this example, the cross coupling circuit 264 is configured to pass in-phase signals from inputs Rx+ and Rx− (e.g., connected to 110, 112 in FIG. 1) to the gate inputs of respective CMVA circuits 260 and 268 as the respective control signals (e.g., via 262 and 266). The cross-coupling circuit is configured to adjust the respective control signals to cause the corresponding FETs to operate with impedances that are matched beyond the impedance-tolerance specification. The cross-coupling circuit 264 is configured to be less dependent on impedance mismatch, beyond the impedance-tolerance specification, by cross coupling the impedance differentials from each of the respective nodes through the AC coupling circuit and to another of the CMVA circuits.

The cross-coupling circuit 264 includes a capacitance-based circuitry (e.g., C1 and C2) for providing AC coupling via each of the plurality of AC signal paths. In this example, the cross-coupling circuit 264 includes first and second resistors and first and second capacitors. The first resistor R1 has a first end coupled to an input 262 of the first CMVA circuit 260 and a second end coupled to the output of the first CMVA circuit. The second resistor R2 has a first end coupled to an input 266 of the second CMVA circuit 268 and a second end coupled to the output of the second CMVA circuit. The first capacitor C1 has a first terminal coupled to the input 262 of the first CMVA circuit 260 and a second terminal coupled to the output (Rx−) of the second CMVA circuit 268. The second capacitor C2 has a first terminal coupled to the input 266 of the second CMVA circuit 268 and a second terminal coupled to the output (Rx+) of the first CMVA circuit 260.

In some embodiments, the cross-coupling circuit 264 is configured to pass signals in a frequency range to facilitate cancellation of signals ensuing from the impedance response of impedance-adjustable current paths of the plurality of CMVA circuits being mismatched beyond the impedance-tolerance specification. For instance, in high frequency data communication applications, differential data signals are located in high frequencies and CM voltages are located at low frequencies. In some embodiments, the cross-coupling circuit 264 is configured to provide low frequency signals (e.g., CM signals) to inputs of the CMVA circuits 260 and 268 to remove the CM signals.

In some embodiments, the respective control signals provided by the cross-coupling circuit have voltage levels that differ by an amount proportional to an amount of impedance mismatch between the FETs of the CMVA circuits. In response to the difference in voltage levels of the control signals, the corresponding FETs exhibit impedances that are more closely matched. In this manner, noise resulting from mismatch beyond the impedance-tolerance specification is reduced.

Figure 3:
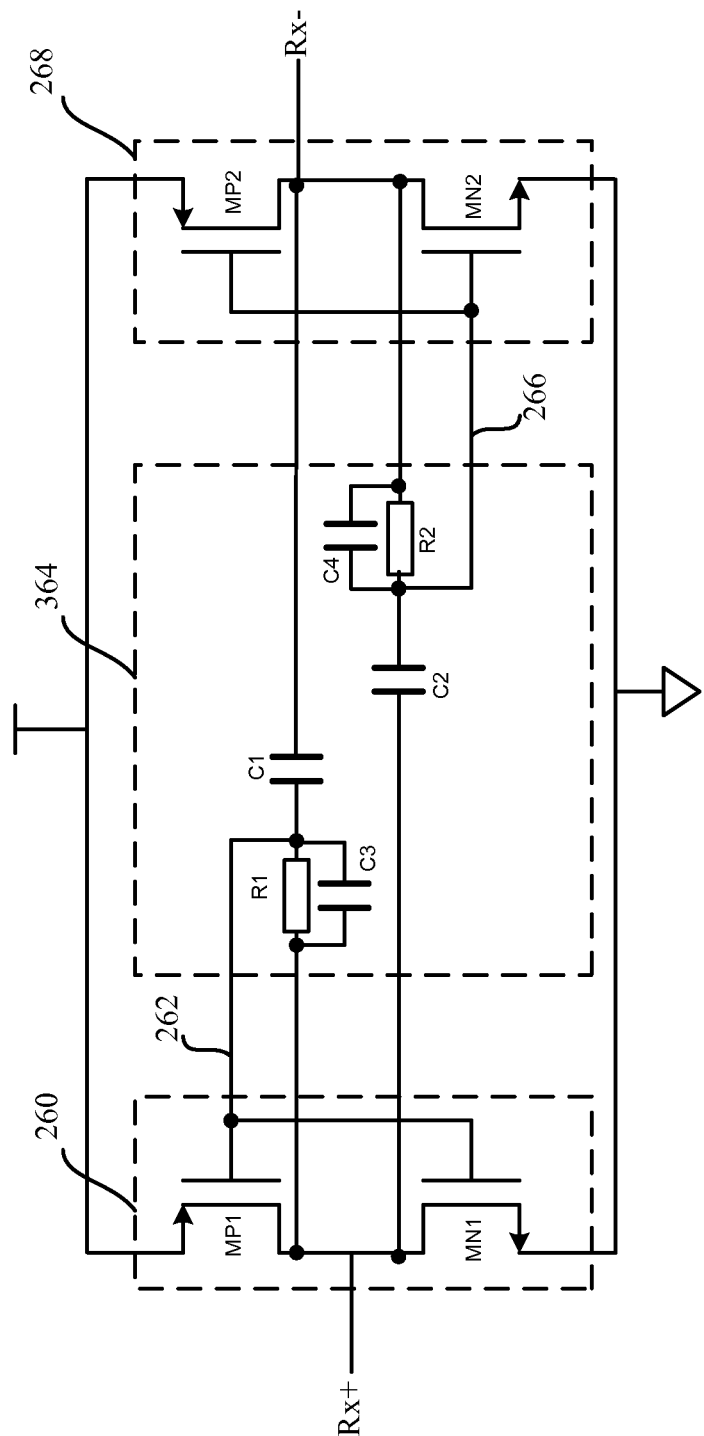
FIG. 3 shows another CM suppression circuit, in accordance with one or more embodiments of the present disclosure.

The cross-coupling circuit may be modified as necessary for a particular application to further adjust the control signals provided to the inputs of the CMVA circuits. As one example, if a larger differential impedance between input nodes 262 and 266 is desired, size of C1 and C2 may be increased—thereby feeding back anti-phase RF signals to the input nodes. As another example, additional capacitors may be placed in parallel with the first and second resistors R1 and R2. For instance FIG. 3 depicts a block diagram of another CM suppression circuit, consistent with one or more embodiments of the present disclosure. Similar to the system described with reference to FIG. 2, the circuit includes a plurality of CMVA circuits 260 and 268, as described with reference to FIG. 2, and a cross-coupling circuit 364. The cross-coupling circuit 364 includes a first resistor R1, a second resistor R2, a first capacitor C1, and a second capacitor C2 arranged as described with reference to the cross-coupling circuit 264 in FIG. 2. In this example, the cross-coupling circuit 364 further includes a third capacitor C3 and a fourth capacitor C4 respectively coupled in parallel with the first and second resistors R1 and R2.

The examples herein are primarily described and illustrated with reference to a pair of signal lines configured to carry differential signals that have opposing phases. However, it is recognized that signals may be communicated using other various numbers of signal lines. For instance, in some other embodiments three signal lines configured and arranged to carry a differential encoded signal.

The skilled artisan would appreciate that the receivers of the systems discussed with reference to the illustrated embodiments would include and/or operate with additional circuitry for signal processing. For example, in some embodiments, the receiver 120 shown in FIG. 1 includes an impedance matching circuit (not shown) coupled to the receiving ends of the upper and lower signal lines (Rx+ and Rx−) to adjust impedance of the receiver circuit 120. As another example, in some embodiments, the receiver 120 includes a driver circuit, following the detection circuit 148, to boost the demodulated signal (data_out) that is output from the detection circuit 148. As yet another example, in some embodiments, the receiver 120 includes a filtering circuit (e.g., low-pass filter, band-pass filter, etc.) to filter out transient signals unrelated to a carrier signal used for modulation.

In some instances, communications can be carried out between multiple circuits placed within a single chip-package (e.g., ball grid array package) and also having voltage isolation barrier therebetween. The various communications can be carried out using different isolation buffer circuits and amplifiers. Various applications are also contemplated including, but not limited to, applications in which small voltage differences exist between transmitters and receivers and applications in which large voltages can exist (e.g., hundreds or thousands of volts as can be used in automotive applications where electric motors are used in place of (or in combination with) combustion engines). Consistent with one or more embodiments discussed herein, U.S. Pat. No. 6,920,576 (filed May 31, 2001; Ehmann, Gregory E.), U.S. Pat. No. 6,882,046 (filed Dec. 18, 2001; Davenport, et al.) and "Signal Isolation Buffer Amplifiers" Burr-Brown, ISO102, ISO106, January 1995, each describe useful technical details, applications and various background information, and each of these documents is fully incorporated herein by reference.

The embodiments are thought to be applicable to a variety of related applications. Other aspects and embodiments will be apparent to those skilled in the art from consideration of the specification. While the present disclosure is amenable to various modifications and alternative forms, specifics thereof have been shown by way of example in the drawings and will be described in further detail. It should be understood that the intention is not to limit the disclosure to the particular embodiments and/or applications described. On the contrary, the intention is to cover all modifications, equivalents, and alternatives falling within the spirit and scope of the present disclosure.

What is claimed is:

1. An apparatus comprising:
   an isolation barrier;
   a first integrated circuit;
   a second integrated circuit;
   a plurality of signal lines configured and arranged to carry information through the isolation barrier via differential signals, thereby conveying information between the first integrated circuit and the second integrated circuit; and
   a common mode suppression circuit coupled to the plurality of signal lines and including:
   a plurality of common mode voltage adjustment circuits, within the second integrated circuit and each configured and arranged to provide a low impedance path for common mode signals and a high impedance path for differential AC signals, thereby suppressing effects of common mode transients, the plurality of common mode voltage adjustment circuits each including components that are impedance matched to corresponding components in another of the plurality of common mode voltage adjustment circuits, the corresponding components being impedance matched up to an impedance-tolerance specification and each of the plurality of common mode voltage adjustment circuits electrically connected to a respective one of the plurality of signal lines; and an AC coupling circuit providing a plurality of AC signal paths, each of the plurality of AC signal paths having a node connected to a respective one of the plurality of common mode voltage adjustment circuits, the AC coupling circuit configured and arranged to be less dependent on impedance mismatch due to the corresponding components being mismatched, beyond the impedance-tolerance specification, by cross coupling the impedance differentials from each of the respective nodes through the AC coupling circuit and to another of the common mode voltage adjustment circuits.

2. The apparatus of claim 1, wherein the isolation barrier is configured and arranged to provide a galvanic isolation barrier, and wherein the AC coupling circuit includes a capacitance-based circuit for providing AC coupling via each of the plurality of AC signal paths.

3. The apparatus of claim 1, wherein the plurality of adjustment circuits and the AC coupling circuit are configured and arranged to provide common mode suppression of noise caused by the corresponding components being impedance mismatched beyond the impedance-tolerance specification.

4. The apparatus of claim 3, wherein the corresponding components are impedance mismatched beyond the impedance-tolerance specification due to process variation, and wherein the plurality of adjustment circuits and the AC coupling circuit are further configured and arranged to provide common mode suppression of noise due to the corresponding components being impedance matched up to the impedance-tolerance specification.

5. The apparatus of claim 1, wherein the second integrated circuit includes an amplifier coupled to the plurality of signal lines and configured and arranged to receive the differential signals.

6. The apparatus of claim 5, wherein the second integrated circuit includes a signal detector responsive to an output signal generated by the amplifier.

7. The apparatus of claim 1, wherein the plurality of signal lines include a pair of lines configured and arranged to carry differential signals that have opposing phases.

8. The apparatus of claim 1, wherein the second integrated circuit includes an amplifier coupled to the plurality of signal lines and configured and arranged to receive the differential signals, the second integrated circuit includes a signal detector responsive to an output signal generated by the amplifier and the plurality of signal lines include a pair of lines configured and arranged to carry differential signals that have opposing phases.

9. The apparatus of claim 8, wherein the isolation barrier is configured and arranged to provide a galvanic isolation barrier, and wherein the AC coupling circuit includes a capacitance-based circuit configured and arranged to provide AC coupling via each of the plurality of AC signal paths, the plurality of common mode voltage adjustment circuits and the AC coupling circuit are configured and arranged to provide common mode suppression of noise due to the corresponding components being impedance mismatched beyond the impedance-tolerance specification and common mode suppression of noise due to the corresponding components being impedance matched up to the impedance-tolerance specification.

10. The apparatus of claim 1, wherein the first integrated circuit is configured and arranged to transmit and receive signals across the barrier.

11. An apparatus comprising:
a first integrated circuit (IC) containing functional circuitry operating in a first voltage domain;
a plurality of signal lines configured and arranged on opposing sides of an isolation barrier configured and arranged to carry signals from a sending side of the signal lines coupled to the first IC, across the isolation barrier, to a receiving side of the signal lines coupled to the second IC;
a second IC coupled to the receiving side of the plurality of signal lines and containing functional circuitry operating in a second voltage domain; and
a common mode suppression circuit disposed on the second IC and including:
a plurality of adjustment circuits, each configured and arranged to adjust voltage of a respective one of the plurality of signal lines in response to a respective control signal, each adjustment circuit including at least one impedance-adjustable current path having an impedance response that is matched, with an impedance response of a corresponding impedance-adjustable current path of another of the plurality of adjustment circuits, up to an impedance-tolerance specification, and that is mismatched beyond the impedance-tolerance specification; and
a cross-coupling circuit configured and arranged to:
pass in-phase signals from the plurality of signal lines to the plurality of adjustment circuits as the respective control signals, and
adjust the respective control signals to cause the corresponding impedance-adjustable current paths to operate with impedances that are matched beyond the impedance-tolerance specification.

12. The apparatus of claim 11, wherein the control signals cause each of the plurality of adjustment circuits to remove common mode voltages from the corresponding one of the plurality of signal lines.

13. The apparatus of claim 11, wherein the cross-coupling circuit is configured and arranged to pass signals in a frequency range to facilitate cancellation of signals ensuing from the impedance response of impedance-adjustable current paths of the plurality of adjustment circuits being mismatched beyond the impedance-tolerance specification.

14. The apparatus of claim 11, wherein each of the plurality of adjustment circuits includes first and second adjustment circuits, each including a clamp circuit having an output coupled to the corresponding one of the plurality of signal lines.

15. The apparatus of claim 14, wherein each clamp circuit is a CMOS inverter circuit and the isolation barrier is arranged to provide galvanic isolation between the functional circuitry of the first IC and the functional circuitry of the second IC.

16. The apparatus of claim 14, wherein the cross-coupling circuit includes:
a first resistor having a first end coupled to an input of the first clamp circuit and a second end coupled to the output of the first clamp circuit;
a second resistor having a first end coupled to an input of the second clamp circuit and a second end coupled to the output of the first clamp circuit;
a first capacitor having a first terminal coupled to the output of the first clamp circuit and a second terminal coupled to the input of the second clamp circuit; and
a second capacitor having a first terminal coupled to the input of the second clamp circuit and a second terminal coupled to the input of the first clamp circuit.

17. The apparatus of claim 16, wherein the cross-coupling circuit further includes:
- a third capacitor having a first terminal coupled to the input of the first clamp circuit and a second terminal coupled to the output of the first clamp circuit; and
- a fourth capacitor having a first terminal coupled to the input of the second clamp circuit and a second terminal coupled to the output of the second clamp circuit.

18. The apparatus of claim 11, wherein a first one of the control signals, corresponding to a first one of the plurality of adjustment circuits, and a second one of the control signals, corresponding to a second one of the plurality of adjustment circuits, have voltage levels that differ by an amount proportional to an amount of mismatch between the impedance-adjustable current paths corresponding to the first one and the second one of the plurality of adjustment circuits.

19. The apparatus of claim 11, wherein the second IC includes an amplifier coupled to the plurality of signal lines and configured and arranged to receive differential signals via the plurality of signal lines.

20. The apparatus of claim 19, wherein the second IC includes a signal detector responsive to an output signal generated by the amplifier.

* * * * *